(12) United States Patent
Leoncavallo

(10) Patent No.: US 9,019,018 B2
(45) Date of Patent: Apr. 28, 2015

(54) INTEGRATED CIRCUIT WITH AN INTERNAL RC-OSCILLATOR AND METHOD FOR CALIBRATING AN RC-OSCILLATOR

(75) Inventor: Ruggero Leoncavallo, Gratkorn (AT)

(73) Assignee: ams AG, Unterpremstaetten (AT)

( * ) Notice: Subject to any disclaimer, the term of this patent is extended or adjusted under 35 U.S.C. 154(b) by 144 days.

(21) Appl. No.: 13/580,955

(22) PCT Filed: Feb. 14, 2011

(86) PCT No.: PCT/EP2011/052145
§ 371 (c)(1),
(2), (4) Date: Oct. 11, 2012

(87) PCT Pub. No.: WO2011/107340
PCT Pub. Date: Sep. 9, 2011

(65) Prior Publication Data
US 2013/0021105 A1 Jan. 24, 2013

(30) Foreign Application Priority Data
Mar. 1, 2010 (EP) .................. 10002076

(51) Int. Cl.
*H03L 7/00* (2006.01)
*H03L 7/099* (2006.01)
(Continued)

(52) U.S. Cl.
CPC .............. *H03L 7/099* (2013.01); *H03B 5/1237* (2013.01); *H03L 7/06* (2013.01); *H03B 5/20* (2013.01); *H03L 7/113* (2013.01)

(58) Field of Classification Search
CPC .......... H03B 5/1237; H03B 5/20; H03L 7/06; H03L 7/113; H03L 7/099
USPC ................ 331/18, 34, 36 C, 177 V, 111, 143; 327/156, 159, 162; 375/376; 455/255, 455/257, 258, 259, 260, 262, 265
See application file for complete search history.

(56) References Cited

U.S. PATENT DOCUMENTS 5,473,640 A 12/1995 Bortolini et al.
5,543,754 A * 8/1996 Onodera .................... 331/25
(Continued)

FOREIGN PATENT DOCUMENTS

CN 1113052 A 12/1995
CN 1722721 A 1/2006
(Continued)

*Primary Examiner* — Arnold Kinkead
*Assistant Examiner* — Richard Tan
(74) *Attorney, Agent, or Firm* — McDermott Will & Emery LLP

(57) ABSTRACT

An integrated circuit (10) has an internal RC-oscillator (20) for providing an internal clock signal (CLI) having an adjustable oscillator frequency. The integrated circuit (10) further comprises terminals (101, 102) for connecting an external LC tank (30) having a resonance frequency and a calibration circuit (40) which is configured to adjust the oscillator frequency based on the resonance frequency of the LC tank (30) connected during operation of the integrated circuit (10). An internal auxiliary oscillator (46) is connected to the terminals (101, 102) in a switchable fashion and is configured to generate an auxiliary clock signal (CLA) based on the resonance frequency. The calibration circuit (40) comprises a frequency comparator (47) which is configured to determine a trimming word (TRW) based on a frequency comparison of the internal clock signal (CLI) and the auxiliary clock signal (CLA). The LC tank (30) to be connected is an antenna for receiving a radio signal.

19 Claims, 3 Drawing Sheets

Figure 1:
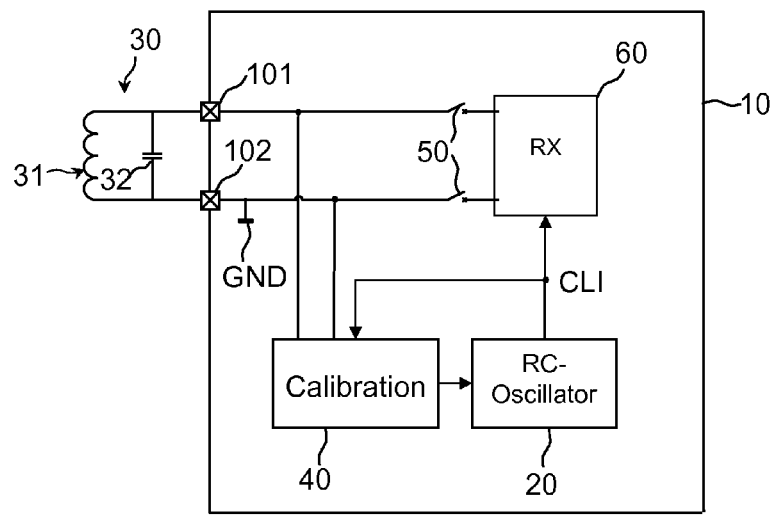

(51) Int. Cl.
*H03B 5/12* (2006.01)
*H03L 7/06* (2006.01)
*H03B 5/20* (2006.01)
*H03L 7/113* (2006.01)

(56) References Cited

U.S. PATENT DOCUMENTS 5,702,426 A * 12/1997 Pons et al. .................. 607/27
5,754,081 A * 5/1998 Kuroiwa et al. ............. 331/49
6,549,082 B2 * 4/2003 Ipek et al. ................... 331/57
6,691,055 B2 2/2004 Walter et al.
7,280,805 B2 10/2007 Xu et al.
2007/0285185 A1 12/2007 Kwon et al.
2009/0174592 A1 * 7/2009 Muellner .................... 342/51
2009/0256674 A1 * 10/2009 Lee et al. ................... 340/5.6

FOREIGN PATENT DOCUMENTS

EP 0590607 A1 9/1993
EP 1111508 A1 12/1999

* cited by examiner

INTEGRATED CIRCUIT WITH AN INTERNAL RC-OSCILLATOR AND METHOD FOR CALIBRATING AN RC-OSCILLATOR

The invention relates to an integrated circuit with an internal RC-oscillator and to a method for calibrating an RC-oscillator integrated in an integrated circuit.

Many integrated circuits include an RC-oscillator for generating and providing an internal clock signal which is to be used within the circuit. For example, multi-vibrators for generating rectangular clock signals are used, wherein a clock frequency depends on an RC time constant of the multi-vibrator. However, due to production tolerances, a desired clock frequency usually has to be trimmed or calibrated for precise operation of the oscillator.

To this end, an external clock signal is provided to a calibration circuit, wherein the external clock signal is generated by means of a crystal oscillator or an external micro-controller. Using the external clock signal, calibration coefficients are determined for the RC-oscillator. These calibration coefficients can be stored in a non-volatile memory during production of the integrated circuit with the RC-oscillator such that the calibration process has only to be performed once. However, the non-volatile memory, for example a one time programmable, OTP, memory, uses areas on the integrated circuit which increases the production costs.

In another conventional way of calibrating an internal RC-oscillator, the above-mentioned crystal oscillator or the micro-controller have to be provided additionally to the integrated circuit for providing the external reference clock signal such that a calibration is performed each time the integrated circuit is powered up. In this case, the calibration coefficients are stored in a volatile memory. However, the external components like crystal oscillator or micro-controller produce additional costs. Furthermore, operating of the crystal oscillator or the micro-controller consumes power which in particular is undesirable in mobile devices.

It is an object of the invention to provide an integrated circuit with an internal RC-oscillator and a method for calibrating an RC-oscillator integrated in an integrated circuit which makes it possible to calibrate the RC-oscillator with improved power efficiency and reduced area on the integrated circuit.

This object is achieved with the subject matter of the independent claims. Further embodiments and developments of the invention are described in the dependent claims.

In one embodiment, an integrated circuit includes an internal RC-oscillator for providing an internal clock signal, the RC-oscillator having an adjustable oscillator frequency. The integrated circuit further comprises terminals for connecting an external LC tank having a resonance frequency. A calibration circuit within the integrated circuit is configured to adjust the oscillator frequency based on the resonance frequency of the LC tank connected during operation of the integrated circuit.

The internal RC-oscillator, for example an RC-based multi-vibrator, can be adjusted regarding its internal oscillator frequency by tuning or switching resistance values, capacitance values or both resistance and capacitance values.

The external LC tank which is used for other purposes of the integrated circuit, for example, as an antenna for the integrated circuit has a resonance frequency which is determined by the inductive components and the capacitive components of the LC tank. Such antenna or LC tank is not part of the integrated circuit but connected externally when producing a circuit arrangement or during operation of the integrated circuit. The resonance frequency of the LC tank is usually given the high precision by using precise components or calibrating of the LC tank during production.

During operation of the integrated circuit, the calibration circuit is connected to the external LC tank via the terminals of the integrated circuit. The calibration circuit employs the characteristics of the LC tank which is used for other purposes of the integrated circuit, in particular the resonance frequency of the LC tank, and uses precise resonance frequencies for calibrating the oscillator frequency of the internal RC-oscillator. Hence, no additional and costly components are necessary. Using of the LC tank characteristics needs little energy, in particular compared to operating a crystal oscillator or a micro-controller. Furthermore, the oscillator frequency can be individually adjusted to the resonance frequency of the respective LC tank connected. Hence, the RC-oscillator frequency is not limited to a fixed resonance frequency. This is, for example, useful if the internal oscillator frequency has a desired dependency on the resonance frequency of the external LC tank.

During calibration by means of the calibration circuit, the oscillator frequency can be set to an integer multiple of the resonance frequency or to a non-integer multiple of the resonance frequency. Preferably, the calibration circuit is configured to adjust the oscillator frequency such that it is substantially the same as the resonance frequency.

In one embodiment, the calibration circuit is configured to adjust the oscillator frequency by means of a trimming word. For example, the trimming word is used to switch on or off capacitive or resistive elements for adjusting the oscillator frequency. For example, the trimming word can be stored in a volatile memory comprised by the integrated circuit. In this case, calibration of the internal RC-oscillator is performed every time the integrated circuit is powered up. Preferably, the calibration is performed in a power-up mode of operation before normal mode of operation. Once calibrated, the precision of the oscillator frequency is usually sufficient for the time the integrated circuit is operated or powered, respectively. However, a calibration process could be started again at a later stage of operation, if necessary.

During a normal mode of operation of the integrated circuit, the LC tank is connected to a different circuit part of the integrated circuit, for example to a receiver for receiving a radio signal. In other words, in some embodiments, the LC tank is an antenna for receiving a radio signal.

There are several ways for calibrating the internal oscillator frequency based on the resonance frequency. In one particular embodiment, the integrated circuit further comprises an internal auxiliary oscillator which is connected to the terminals in a switchable fashion. The auxiliary oscillator is configured to generate an auxiliary clock signal based on the resonance frequency, for example having a clock frequency being equal resonance frequency. The calibration circuit comprises a frequency comparator which is configured to determine the trimming word based on a frequency comparison of the internal clock signal and the auxiliary clock signal.

For example, the oscillator frequency is increased if it is lower than the frequency of the auxiliary clock signal, and decreased if it is higher than the frequency of the auxiliary clock signal.

In one embodiment, the frequency comparison comprises evaluating a logic state of the internal clock signal at predefined clock edges of the auxiliary clock signal. For example, if the internal clock signal of the RC-oscillator is in a high state at a rising clock edge of the auxiliary clock signal, this means that the oscillator frequency is faster or higher than the frequency of the auxiliary clock signal. In this case, the clock frequency of the RC-oscillator has to be decreased until the oscillator frequency is equal or lower than the frequency of the auxiliary clock signal. Preferably, the internal clock signal is restarted in synchronicity with the clock edges of the auxiliary clock signal in this case.

If the internal clock signal has a low state at a rising clock edge of the auxiliary clock signal, the oscillator frequency is slower or lower than the frequency of the auxiliary clock signal. Hence, the oscillator frequency has to be increased in this case.

In another particular embodiment, the calibration circuit is configured to provide the internal clock signal to the terminals and to adjust the oscillator frequency based on an evaluation of a signal resulting at the terminals. In other words, a signal at the LC tank resulting from the internal clock signal is evaluated to determine differences between the resulting signal and the internal clock signal.

For example, an output of the RC-oscillator is coupled to the terminals by means of a capacitor. In this case, the calibration circuit comprises a detection device which is configured to determine a phase difference between the internal clock signal and the signal resulting at the terminals based on a voltage across the capacitor. For example, if the oscillator frequency is substantially equal to the resonance frequency of the LC tank connected to the terminals, a phase difference of 90° will result. Accordingly, the calibration circuit will try to adjust the internal RC-oscillator such that the 90° phase difference is achieved.

It should be noted that the calibration of the internal RC-oscillator is not limited to the circuits described above but also includes other circuits which use the characteristics of an LC tank connected to terminals of the integrated circuits.

In one embodiment of a calibration method, an RC-oscillator integrated in an integrated circuit is calibrated. To this end, an external LC tank having a resonance frequency is connected to terminals of the integrated circuit. An internal clock signal having an oscillator frequency is generated by means of the RC-oscillator. The oscillator frequency is adjusted based on the resonance frequency. The various embodiments of the integrated circuit described above can also be employed for the calibration method.

The following description of figures of exemplary embodiments may further illustrate and explain the invention. Elements with the same structure and the same effect, respectively, appear with equivalent reference symbols. Insofar as circuits or elements correspond to one another in terms of their function in different figures, the description thereof is not repeated for each of the following figures.

Figure 2:
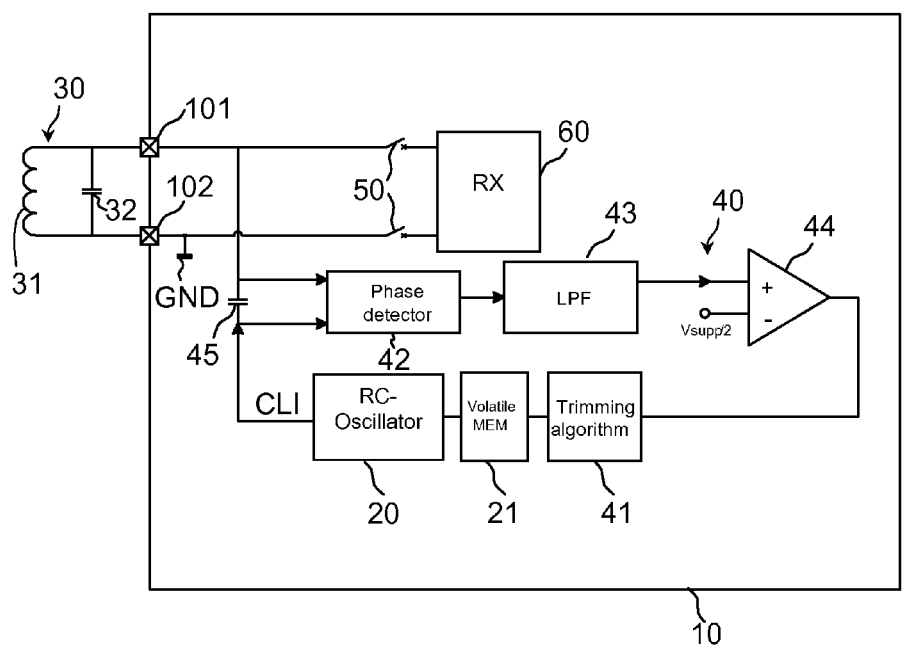
Figure 3:
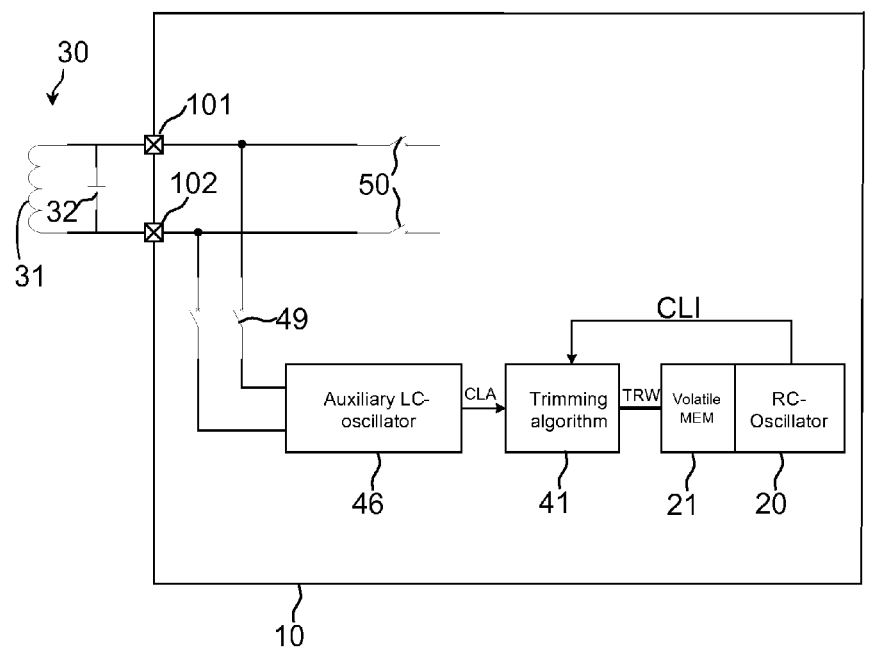
Figure 4:
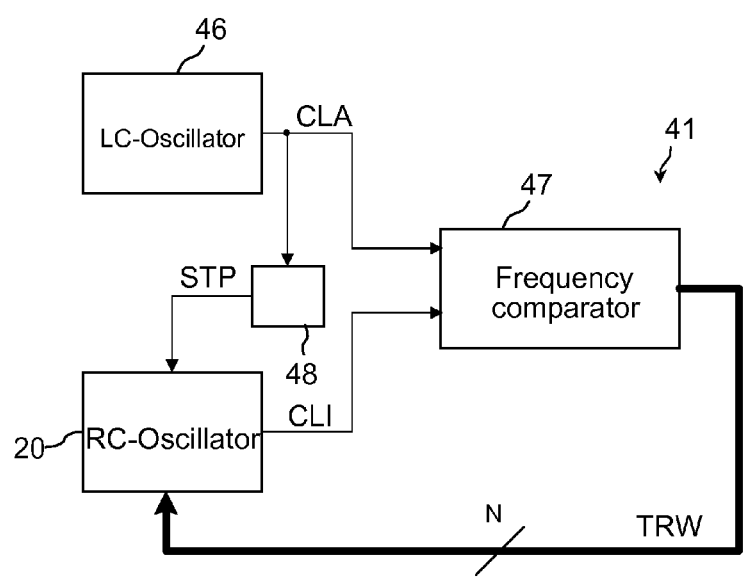
Figure 5:
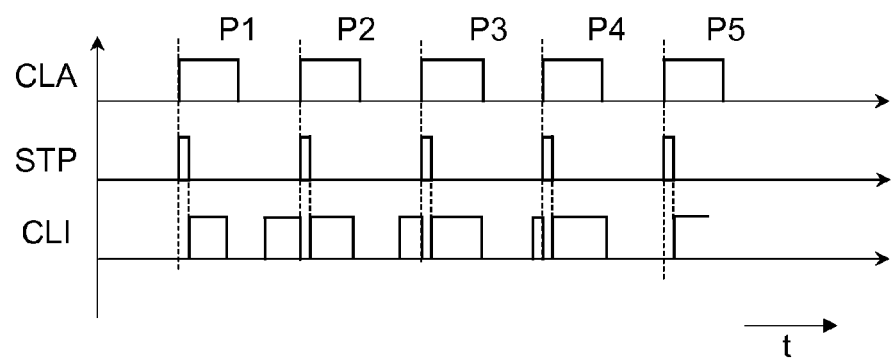

FIG. 1 shows a first exemplary embodiment of an integrated circuit with an internal RC-oscillator, FIG. 2 shows a second exemplary embodiment of an integrated circuit with an internal RC-oscillator, FIG. 3 shows a third exemplary embodiment of an integrated circuit with an internal RC-oscillator, FIG. 4 shows a detail of the third embodiment of the integrated circuit, and FIG. 5 shows an exemplary timing diagram of signals within the third embodiment of the integrated circuit.

FIG. 1 shows an exemplary embodiment of an integrated circuit 10 which includes an internal RC-oscillator 20, a calibration circuit 40 and, for example, a receiver 60. The integrated circuit 10 further comprises terminals 101, 102 to which an external LC tank 30 is connected. For example, the LC tank comprises an inductance 31 and a capacitance 32 which, for example, are provided by a radio antenna. The terminals 101, 102 and hence the LC tank 30 are connected to the receiver 60 by means of a switching element 50. Furthermore, the terminals 101, 102 are connected to the calibration circuit 40. A ground connection GND is coupled to the terminal 102.

The calibration circuit 40 is provided with an internal clock signal CLI which is generated by the RC-oscillator 20. Furthermore, the calibration circuit 40 is coupled to the RC-oscillator 20 for adjusting an oscillator frequency of the internal clock signal CLI.

The internal clock signal CLI is also provided to the receiver 60. It should be noted that the receiver 60 is shown in this drawing only as an exemplary circuit block which, during operation of the integrated circuit, is connected to the external LC tank, for example, for receiving a radio signal, and is provided with the internal clock signal CLI for signal processing purposes. In other words, the receiver 60 could be replaced by any signal processing circuit being connected to the LC tank and the internal RC-oscillator 20.

It should be noted that the LC tank 30 is not part of the integrated circuit but only connected to the terminals 101, 102 during operation of the integrated circuit 10.

When the integrated circuit 10 is powered up, the RC-oscillator 20 is usually uncalibrated and no calibration information is stored within the integrated circuit 10. Hence, during the startup mode of operation, the receiver 60 is disconnected from the terminals 101, 102 and the calibration circuit 40 gets connected to the terminals 101, 102. The calibration circuit 40 evaluates the resonance frequency of the LC tank 30 and uses said information for calibrating the RC-oscillator 20. In other words, the internal clock signal CLI, which is also provided to the calibration circuit 40, is set in relationship to the resonance frequency of the LC tank to determine calibration information for the RC-oscillator 20. The calibration information can be stored in a volatile memory which is used to set a corresponding configuration of resistive and/or capacitive elements of the RC-oscillator 20. For example, the RC-oscillator is an RC-based multi-vibrator.

After the RC-oscillator has been calibrated with a sufficient precision, the switching element 50 can be closed for a normal mode of operation of the integrated circuit 10. For example, in a normal mode of operation, the receiver 60 then receives a radio signal via an antenna forming the LC tank 30.

FIG. 2 shows another embodiment of an integrated circuit 10 which is a development of the integrated circuit 10 of FIG. 1. In the embodiment of FIG. 2, the RC-oscillator 20 is connected to the terminal 101 by means of a capacitor 45. The calibration circuit 40 in the embodiment of FIG. 2 comprises a phase detector 42, a low pass filter 43, a comparator 44 and a trimming block 41. An input of the phase detector 42 is connected to two ends of the capacitor 45. An output of the phase detector 42 is coupled to the low pass filter 43 whose output is coupled to a non-inverting input of the comparator 44. An inverting input of the comparator 44 is provided with a reference potential which, for example, is half the supply voltage of the integrated circuit. An output of the comparator 44 is coupled to the trimming block 41 for providing a comparison result. The trimming block 41 is coupled to a volatile memory 21 for providing a trimming information which is used to adjust the oscillator frequency of the RC-oscillator 20.

During calibration of the RC-oscillator 20, the internal clock signal CLI is provided to the LC tank 30 via the capacitor 45. A frequency difference between the signal produced by the RC-oscillator and the self-resonance frequency of the LC tank is converted into a phase difference on the two pins of the coupling capacitor 45. The phase detector 42 generates a signal whose duty cycle is proportional to that phase difference. The output signal of the phase detector 42 having the duty cycle is converted into a DC voltage by the low pass filter 43. If the oscillator frequency of the RC-oscillator 20 matches with the resonance frequency of the LC tank, the phase difference will be 90° which, for example, results in a duty cycle of 50%. Hence, the resulting DC voltage at the output of the low pass filter 43 will be at about half of the supply voltage which is supplied to the low pass filter 43.

As a consequence, the comparison result at the output of the comparator 44 will indicate whether the oscillator frequency of the RC-oscillator is higher or lower than the resonance frequency of the external LC tank. In other words, the phase detector 42, the low pass filter 43 and the comparator 44 form a detection device which is configured to determine a phase difference between the internal clock signal CLI and the signal resulting at the terminals 101, 102, wherein a voltage across the capacitor 45 is used for this purpose. Furthermore, the detection device is configured to detect whether the internal clock signal CLI has a higher or a lower frequency than the resonance frequency of the LC tank. The comparison result of the comparator 44 is used by the trimming block 41 for adjusting the oscillator frequency of the RC-oscillator 20.

In particular, the trimming block will try to adjust the oscillator frequency such that a voltage at the input of the comparator 44 is as close to the half of the supply voltage as possible due to the closed loop structure. An actual frequency of the RC-oscillator is determined by the calibration information stored in the volatile memory 21. For example, the trimming algorithm determines a trimming word having a predetermined word length. Each bit of the trimming word can set a specific component of the RC-oscillator, for example switch on or off a specific capacitance value. If the trimming block 41 decides that the oscillator frequency of the RC-oscillator 20 is calibrated sufficiently, the trimming word stored in the volatile memory 21 remains unchanged for later operation during which the internal clock signal CLI is provided, for example, to the receiver 60.

FIG. 3 shows another embodiment of the integrated circuit 10 which is based on the embodiment shown in FIG. 1. The receiver 60 is omitted in FIG. 3 for reasons of a better overview only. However, a receiver or a similar signal processing circuit can be connected to the terminals 101, 102 via the switching element 50 in this embodiment. The integrated circuit 10 comprises an auxiliary LC oscillator 46 which is integrated within the integrated circuit and connected to the terminals 101, 102 or the LC tank 30, respectively, by means of a switching element 49. An output of the auxiliary oscillator 46 is coupled to a trimming block 41 which is connected to the RC-oscillator 20 for receiving the internal clock signal CLI and to the volatile memory 21 for providing the trimming word TRW.

During the calibration mode of operation, the switching element 50 is open and the switching element 49 is closed such that the auxiliary oscillator 46 is connected to the LC tank 30. The auxiliary oscillator 46 uses the LC characteristics of the LC tank 30 to generate an auxiliary clock signal CLA. The trimming block 41 receives both the internal clock signal CLI and the auxiliary clock signal CLA and performs a frequency comparison for the two clock signals. The comparison result is used to adjust the RC-oscillator by means of the trimming word TRW. For example, the oscillator frequency of the clock signal CLI is adjusted such that it has a fixed ratio compared to the frequency of the auxiliary clock signal. The frequency of the auxiliary clock signal CLA can be the resonance frequency of the LC tank 30 or a frequency derived from said resonance frequency. However, in the following description, it is assumed that the frequency of the auxiliary clock signal CLA is substantially the same as the resonance frequency and the internal clock signal CLI is calibrated such that the oscillator frequency is also substantially the same as the resonance frequency. A detailed function of the trimming algorithm performed in the trimming block 41 is described with reference to FIG. 4.

FIG. 4 shows a detail of the trimming block 41 together with the RC-oscillator 20 and the auxiliary LC oscillator 46. The trimming block 41 comprises a frequency comparator 47 and a pulse generator 48. The frequency comparator 47 comprises two clock inputs to which the LC oscillator 46 and the RC-oscillator 20 are connected for providing the auxiliary clock signal and the internal clock signal, respectively. An output of the frequency comparator is connected to the RC-oscillator 20 for providing an N-bit trimming word TRW. A volatile memory 21 is not shown in FIG. 4 for reasons of a better overview only. An output of the LC oscillator 46 is connected to the pulse generator 48 whose output is coupled to the RC-oscillator 20 for providing a pulse signal STP.

During the calibration mode of operation, the LC oscillator 46 continuously provides the auxiliary clock signal CLA to the frequency comparator 47. Furthermore, the auxiliary clock signal CLA is provided to the pulse generator 48. The pulse generator 48 generates a short pulse signal STP at positive or negative clock edges of the auxiliary clock signal CLA, wherein a duration of the pulses in the pulse signal STP is neglectable compared to a pulse width of the auxiliary pulse signal CLA. The RC-oscillator 20 is set up such that it operates normally if no pulse is present in the pulse signal STP, and that it is reset at each pulse in a pulse signal STP. For example, the internal clock signal CLI takes a low state during the time of the pulse in the pulse signal STP and starts a new clock period after the pulse in the pulse signal STP has finished. In other words, the beginning of a clock period of internal clock signal CLI is synchronized to the beginning of a clock period of the auxiliary clock signal CLA by means of the pulse signal STP. Hence, the pulse signal STP acts as a start/stop signal for the RC-oscillator 20. A circuit implementation of the RC-oscillator 20, in particular a multi-vibrator being resettable is not shown or described in more detail, as such circuits are well-known in the art.

The frequency comparator 47 evaluates the states of the auxiliary clock signal CLA and the internal clock signal CLI at predetermined clock edges, i.e. rising or falling clock edges, of the auxiliary clock signal CLA. In this evaluation, it is assumed that the oscillator frequency of the internal clock signal CLI is too high if both clock signals CLA, CLI have the same state at the evaluation instant. Similarly, it is assumed that the oscillator frequency is too low if the state of the internal clock signal CLI is different from the state of the auxiliary clock signal CLA. This assumption is based on the fact that in an ideal, calibrated case, the clock edges of the internal clock signal CLI would be coincident with the clock edges of the auxiliary clock signal CLA. Based on the evaluation at each evaluation instant, the trimming word TRW is adapted accordingly to adjust the RC-oscillator 20 and the oscillator frequency of the internal clock signal CLI, respectively.

FIG. 5 shows a time diagram of an exemplary calibration process performed with the arrangement shown in FIG. 4. The upmost diagram shows the auxiliary clock signal CLA with a constant clock frequency based on the resonance frequency of the external LC tank. The middle diagram shows the pulse signal STP generated by the pulse generator 48 at each positive clock edge of the auxiliary clock signal CLA. The third diagram shows the internal clock signal CLI during the calibration process. It can be seen that during the high state of the pulse signal STP, the internal clock signal CLI is in a low state and starts with a new clock period at the end of the pulse signal STP. It should be noted that the duration of the pulse signal STP is not drawn to scale for reasons of a better overview. Hence, in a practical implementation, a time shift between the beginnings of the clock periods of the clock signals CLA, CLI is neglectable.

During a first clock period P1, the internal clock signal CLI is set or adjusted by an initial trimming word TRW. As can be seen from the diagram, the clock period of the internal clock signal CLI in the first period P1 is significantly shorter than the clock period of the auxiliary clock signal CLA. Hence, the oscillator frequency of the RC-oscillator 20 is too high. As a consequence, at the beginning of the second clock period P2, the frequency comparator 47 detects that the internal clock signal CLI is already in a high state which lets the frequency comparator 47 reduce the oscillator frequency of the RC-oscillator 20 by adjusting the trimming word TRW, for example by altering one bit of the trimming word TRW. After adjusting the trimming word TRW, the new clock period P2 is started in the RC-oscillator 20, resulting in a new clock cycle of the internal clock signal CLI. However, it can be seen from the diagram that the oscillator frequency of the internal clock signal CLI is still too high. Hence, at the beginning of the third clock period P3, a similar process as described before is performed in the frequency comparator 47, resulting again in an adjustment of the trimming word TRW and starting of a new clock cycle of the internal clock signal CLI for the clock period P3.

It can be seen from the diagram that during the clock period P3, the oscillator frequency of the internal clock signal CLI is almost identical to the frequency of the auxiliary clock signal CLA but still too high. Hence, at the beginning of the fourth clock period P4, the oscillator frequency of the internal clock signal CLI is further reduced such that at the beginning of the fifth clock period P5, the internal clock signal CLI is at a low state. It is hence assumed that the oscillator frequency of the internal clock signal CLI is lower than the frequency of the auxiliary clock signal CLA then. Furthermore, this relative change of states can be interpreted such that the calibration process can be stopped or, in other words, a final value for the trimming word TRW is found. Accordingly, the calibration mode of operation can be stopped and the integrated circuit 10 can be set to a normal mode of operation during which the RC-oscillator 20 is operated with said trimming word TRW.

It should be noted that in the above example, the oscillator frequency was too high at the beginning of the calibration process. However, if the oscillator frequency is too low at the beginning of the calibration process, the frequency comparator 47 will increase the oscillator frequency similar to the procedures described above.

If a radio antenna is used as the LC tank 30, the self-resonance frequency of the antenna is usually adapted to a frequency of a radio signal to be received over said antenna. For example, in a wake-up receiver, it is detected whether a radio signal with said predetermined frequency is received. This is done by evaluating the radio signal such that a defined number of clock pulses is present in the radio signal during a clock period defined by the internal clock signal CLI. For example, a time window is defined by a given number of clock periods of the internal clock signal CLI, and a distinct number of clock pulses in the radio signal are counted within this time window. If the number of counted clock pulses is correct, it is assumed that the radio signal received over the antenna is not only noise but a data signal which should be processed in further circuit parts of the integrated circuit 10. As a consequence, a desired frequency of the data signal can be set by adjusting the resonance frequency of the antenna beforehand, and the integrated circuit 10 and the RC-oscillator 20, respectively, will be adapted to the resonance frequency of the antenna connected in each case. Hence, the integrated circuit according to one of the embodiments described above is more flexible with respect to the calibration of the internal RC-oscillator 20.

REFERENCE LIST 10 integrated circuit
20 RC-oscillator
21 volatile memory
30 LC tank
31 inductance
32 capacitance
40 calibration circuit
41 trimming block
42 phase detector
43 low pass filter
44 comparator
45 capacitor
46 LC oscillator
47 frequency comparator
48 pulse generator
49, 50 switching element
60 receiver
101, 102 terminal
CLI, CLA clock signal
STP pulse signal
TRW trimming word

The invention claimed is:

1. An integrated circuit for receiving and processing a radio signal, the integrated circuit comprising:
 an internal RC-oscillator for providing an internal clock signal having an adjustable oscillator frequency;
 terminals for connecting an external LC tank having a resonance frequency;
 a calibration circuit which is configured to adjust the oscillator frequency based on the resonance frequency of the LC tank connected during operation of the integrated circuit; and
 an internal auxiliary oscillator which is connected to the terminals in a switchable fashion and is configured to generate an auxiliary clock signal based on the resonance frequency, wherein the calibration circuit comprises a frequency comparator which is configured to determine a trimming word for adjusting said oscillator frequency based on a frequency comparison of the internal clock signal and the auxiliary clock signal,
 wherein the LC tank to be connected is an antenna for receiving said radio signal.

2. The integrated circuit according to claim 1, wherein the calibration circuit is configured to adjust the oscillator frequency such that it is substantially the same as the resonance frequency.

3. The integrated circuit according to claim 1, wherein the calibration circuit is configured to adjust the oscillator frequency by means of the trimming word.

4. The integrated circuit according to claim 1, further comprising a volatile memory for storing the trimming word.

5. The integrated circuit according to claim 1, wherein the frequency comparison comprises evaluating a logic state of the internal clock signal at predefined clock edges of the auxiliary clock signal.

6. The integrated circuit according to claim 1, wherein a beginning of a clock period of the internal clock signal is synchronized to a beginning of a clock period of the auxiliary clock signal by means of a pulse signal, which comprises short pulses at positive or negative clock edges of the auxiliary clock signal.

7. The integrated circuit according to claim 6, wherein a duration of the pulses in the pulse signal is negligible compared to a pulse width of the auxiliary pulse signal.

8. An integrated circuit for receiving and processing a radio signal, the integrated circuit comprising:
    an internal RC-oscillator for providing an internal clock signal having an adjustable oscillator frequency;
    terminals for connecting an external LC tank having a resonance frequency, the LC tank to be connected being an antenna for receiving said radio signal; and
    a calibration circuit which is configured to adjust the oscillator frequency based on the resonance frequency of the LC tank connected during operation of the integrated circuit,
    wherein the calibration circuit is configured to provide the internal clock signal to the terminals and to adjust the oscillator frequency based on an evaluation of a signal resulting at the terminals,
    wherein an output of the RC-oscillator is coupled to the terminals by means of a capacitor, and
    wherein the calibration circuit comprises a detection device which is configured to determine a phase difference between the internal clock signal and the signal resulting at the terminals based on a voltage across the capacitor.

9. The integrated circuit according to claim 8, wherein the calibration circuit is configured to adjust the oscillator frequency such that it is substantially the same as the resonance frequency.

10. The integrated circuit according to claim 8, wherein the calibration circuit is configured to adjust the oscillator frequency by means of a trimming word.

11. The integrated according to claim 10, further comprising a volatile memory for storing the trimming word.

12. A method for calibrating an RC-oscillator integrated in an integrated circuit, the method comprising:
    connecting an external LC tank having a resonance frequency to terminals of the integrated circuit;
    generating, by means of the RC-oscillator, an internal clock signal having an oscillator frequency;
    adjusting the oscillator frequency based on the resonance frequency;
    closing switches between the terminals and an auxiliary oscillator, which is integrated in the integrated circuit such that the auxiliary oscillator is connected to the terminals;
    generating an auxiliary clock signal based on the resonance frequency by means of the auxiliary oscillator; and
    determining a trimming word for adjusting said oscillator frequency based on a frequency comparison of the internal clock signal and the auxiliary clock signal,
    wherein the external LC tank is an antenna for receiving a radio signal to be processed by the integrated circuit.

13. The method according to claim 12, wherein the oscillator frequency is adjusted by the trimming word.

14. The method according to claim 12, wherein the trimming word is stored in a volatile memory of the integrated circuit.

15. The method according to claim 12, wherein a beginning of a clock period of the internal clock signal is synchronized to a beginning of a clock period of the auxiliary clock signal by means of a pulse signal, which comprises short pulses at positive or negative clock edges of the auxiliary clock signal.

16. The method according to claim 15, wherein a duration of the pulses in the pulse signal is negligible compared to a pulse width of the auxiliary pulse signal.

17. A method for calibrating an RC-oscillator integrated in an integrated circuit, wherein an output of the RC-oscillator is coupled to terminals of the integrated circuit by means of a capacitor, the method comprising:
    connecting an external LC tank having a resonance frequency to the terminals;
    generating, by means of the RC-oscillator, an internal clock signal having an oscillator frequency;
    providing the internal clock signal to the terminals; and
    adjusting the oscillator frequency based on an evaluation of a signal resulting at the terminals, the evaluation comprising determination of a phase difference between the internal clock signal and the signal resulting at the terminals based on a voltage across the capacitor,
    wherein the external LC tank is an antenna for receiving a radio signal to be processed by the integrated circuit.

18. The method according to claim 17, wherein the oscillator frequency is adjusted such that it is substantially the same as the resonance frequency.

19. The method according to claim 17, wherein the oscillator frequency is adjusted by means of a trimming word.

* * * * *